US010037791B2

(12) United States Patent
Sanasi

(10) Patent No.: US 10,037,791 B2
(45) Date of Patent: *Jul. 31, 2018

(54) APPARATUSES AND METHODS FOR SETTING A SIGNAL IN VARIABLE RESISTANCE MEMORY

(71) Applicant: Micron Technology, Inc., Boise, ID (US)

(72) Inventor: Alessandro Sanasi, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/613,757

(22) Filed: Jun. 5, 2017

(65) Prior Publication Data

US 2017/0270989 A1  Sep. 21, 2017

Related U.S. Application Data

(60) Continuation of application No. 15/388,971, filed on Dec. 22, 2016, now Pat. No. 9,672,888, which is a continuation of application No. 15/155,880, filed on May 16, 2016, now Pat. No. 9,530,477, which is a division of application No. 14/524,567, filed on Oct. 27, 2014, now Pat. No. 9,343,133.

(51) Int. Cl.
*G11C 11/00* (2006.01)
*G11C 11/16* (2006.01)

(52) U.S. Cl.
CPC ...... *G11C 11/1675* (2013.01); *G11C 11/1673* (2013.01)

(58) Field of Classification Search
CPC ............ G11C 13/0026; G11C 13/0069; G11C 2013/009
See application file for complete search history.

(56) References Cited

U.S. PATENT DOCUMENTS

| | | | |
|---|---|---|---|
| 7,907,437 B2 | 3/2011 | Lee et al. | |
| 9,343,133 B1 | 5/2016 | Sanasi | |
| 9,530,477 B2 | 12/2016 | Sanasi et al. | |
| 9,672,888 B2 * | 6/2017 | Sanasi | G11C 11/1675 |
| 2006/0023497 A1 | 2/2006 | Kawazoe et al. | |
| 2006/0120145 A1 | 6/2006 | Ezaki et al. | |
| 2007/0159867 A1 | 7/2007 | Muraoka et al. | |
| 2008/0080238 A1 * | 4/2008 | Yuda | G11C 11/5671 |
| | | | 365/185.03 |
| 2008/0106926 A1 | 5/2008 | Brubaker et al. | |
| 2010/0080037 A1 * | 4/2010 | Inoue | G11C 13/0007 |
| | | | 365/148 |

(Continued)

*Primary Examiner* — Tuan T Nguyen

(74) *Attorney, Agent, or Firm* — Schwegman Lundberg & Woessner, P.A.

(57) ABSTRACT

An example of a method reads a spin torque transfer (STT) memory cell, and writes the STT memory cell using information obtained during the reading of the STT memory cell to set a pulse to write the STT memory cell. An example of an apparatus includes a STT memory cell and read/write circuitry coupled to the STT memory cell to determine a read current ($I_{READ}$) through the STT memory cell and to set a pulse to write the STT memory cell using $I_{READ}$. Additional embodiments are disclosed.

20 Claims, 8 Drawing Sheets

(56) References Cited

U.S. PATENT DOCUMENTS

| | | |
|---|---|---|
| 2010/0118593 A1 | 5/2010 | Cho et al. |
| 2010/0195372 A1* | 8/2010 | Toda ................. G11C 11/56 |
| | | 365/148 |
| 2012/0087183 A1 | 4/2012 | Chang |
| 2012/0297268 A1 | 11/2012 | Ishihara et al. |
| 2013/0083048 A1 | 4/2013 | Weiss |
| 2013/0148406 A1* | 6/2013 | Shimakawa ........ G11C 11/1673 |
| | | 365/148 |
| 2014/0244931 A1 | 8/2014 | Kim |
| 2016/0012884 A1* | 1/2016 | Toda ................. G11C 11/5614 |
| | | 365/148 |
| 2016/0072493 A1 | 3/2016 | Oh |
| 2016/0118101 A1* | 4/2016 | Sanasi ................ G11C 11/1675 |
| | | 365/158 |
| 2016/0172026 A1 | 6/2016 | Lee |
| 2016/0196876 A1* | 7/2016 | Lee ................... G11C 13/0026 |
| | | 365/63 |
| 2016/0260468 A1 | 9/2016 | Sanasi |
| 2017/0103794 A1 | 4/2017 | Sanasi |

\* cited by examiner

APPARATUSES AND METHODS FOR SETTING A SIGNAL IN VARIABLE RESISTANCE MEMORY

PRIORITY APPLICATION

This application is a continuation of U.S. application Ser. No. 15/388,971, filed Dec. 22, 2016, which is a continuation of U.S. application Ser. No. 15/155,880, filed May 16, 2016, now issued as U.S. Pat. No. 9,530,477, which is a divisional of U.S. application Ser. No. 14/524,567, filed Oct. 27, 2014, now issued as U.S. Pat. No. 9,343,133, all of which are incorporated herein by reference in their entirety.

BACKGROUND

Magnetic Random Access Memory (MRAM) is a non-volatile computer memory technology based on magnetoresistance. Unlike typical volatile Random Access Memory (RAM) technologies which store data as electric charge, data in MRAM is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers, or antiparallel, giving a higher electrical resistance across the layers. The switching of the magnetic orientation of the free layer and the resulting high or low resistance states across the magnetic layers controls the state of a typical MRAM cell.

A type of MRAM cell is a spin torque transfer (STT) cell. A conventional STT cell includes a magnetic tunnel junction (MTJ) that functions as a magnetoresistive data storing element with a pinned magnetic layer and a free magnetic layer, and an insulating layer between the pinned and the free magnetic layers. An example of an insulating layer is magnesium oxide (MgO). The STT cell is coupled between an access device and a data line. The MTJ can be viewed as a multi-state resistor due to different relative orientations (e.g., parallel and antiparallel) of the magnetic moments, which can change the magnitude of a current flowing (e.g., passing) through the cell. Magnetic fields caused by currents flowing through the MTJ can be used to switch a magnetic moment direction of the free magnetic layer of the MTJ, which can place the device in a high or low resistance state. The pinned layer polarizes the electron spin of the programming current, and torque is created as the spin-polarized current flows through the MTJ. The spin-polarized electron current interacts with the free layer by exerting a torque on the free layer. When the spin-polarized electron current flowing through the MTJ is greater than a critical switching current density ($J_C$) for writing the cell, the torque exerted by the spin-polarized electron current is sufficient to switch the magnetization of the free layer and thus change the resistance state across the MTJ. A read process can then be used to determine the state of cell, using a read pulse that causes a current to flow through the MTJ that has a sufficiently small magnitude to not disturb the state of the MTJ.

STT technology has some advantageous characteristics compared to other MRAM technology. The STT cell does not need an external magnetic field to switch the free layer but rather uses the spin-polarized electron current to switch the free layer. Further, scalability is improved with STT technology as the programming current decreases with decreasing cell sizes. Additionally, STT technology can provide a larger ratio between high and low resistance states, which improves read operations.

In writing a STT cell, the amplitude of a programming signal, such as a current or voltage pulse (referred to herein as a write pulse), is selected to be high enough to reduce or minimize the bit error rate (BER). However, this write pulse may cause some over stress of the tunnel barrier between the free and pinned magnetic layers of the MTJ. The tunnel barrier may be a tunnel oxide such as magnesium oxide (MgO). This stress may be attributable to the array topology, or to process spreads that reflect variability in the manufacturing process that may affect the MTJ and/or the access device. This stress may reduce the endurance of the memory cell as the stress may cause writing and reading failures after fewer write cycles.

BRIEF DESCRIPTION OF THE DRAWINGS

Embodiments of the invention are illustrated by way of example and not limitation in the figures of the accompanying drawings in which.

DETAILED DESCRIPTION

Figure 1:
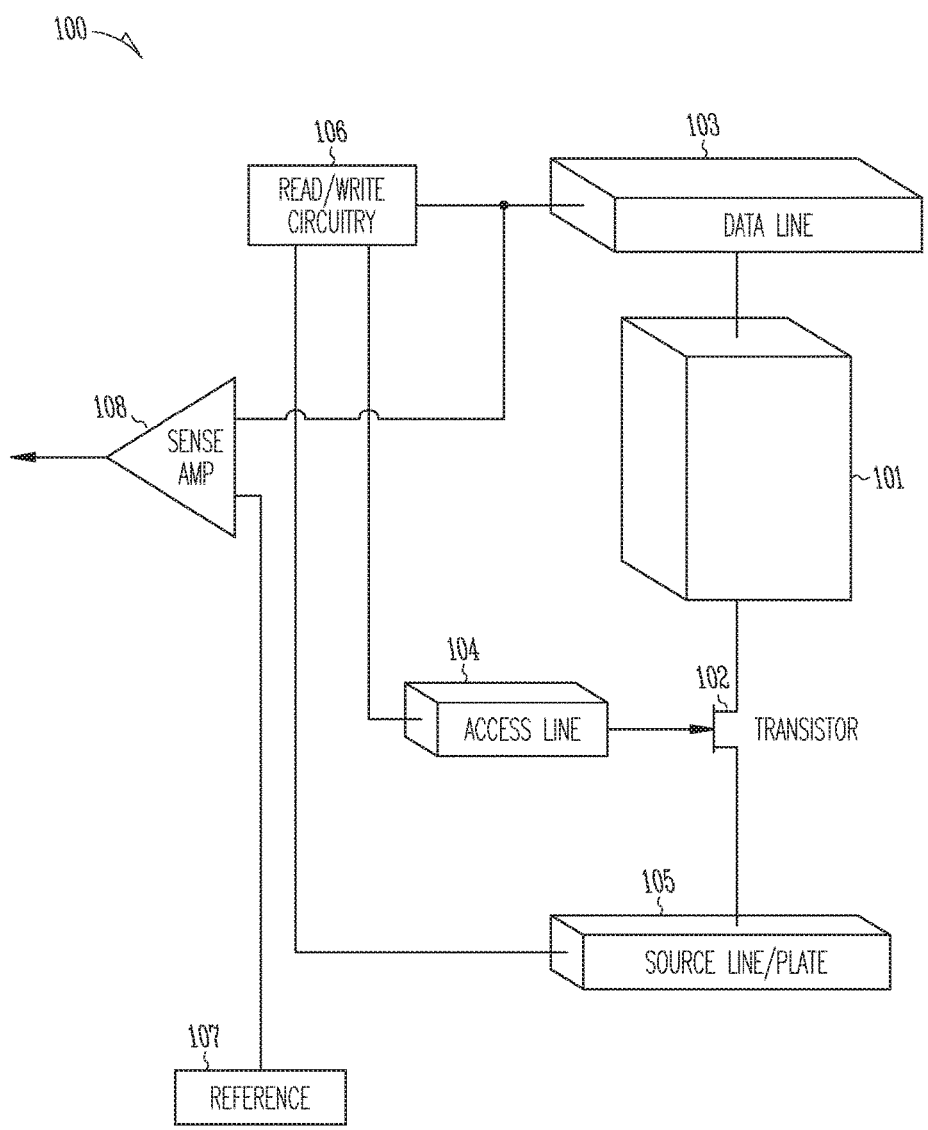
FIG. 1 illustrates a portion of a memory with a STT cell coupled to an access device.

The following detailed description refers to the accompanying drawings that show, by way of illustration, and not limitation, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

A STT cell can be written by switching the magnetization of the free layer in the cell's MTJ. Switching occurs when the programming current density flowing through the memory cell is greater than the critical switching current density ($J_C$). Thus, to write the cell, the programming current density need only be slightly greater than $J_C$. An embodiment of the present subject matter can determine the appropriate programming current density to use based on a cell current sensed in relation to (e.g., during) reading of the cell. This can be used to ensure that the programming current density is greater than $J_C$ and thus improves the BER and reliability of the write pulse. This can further be used to ensure that the programming current density is not unnecessarily greater than $J_C$, thereby reducing oxide interface stress. This programming scheme should be insensitive to process spread (e.g. variability induced by the manufacturing process) that impacts the access device.

A STT cell is conventionally read by applying a low-amplitude current or voltage pulse (e.g. read pulse) to the cell. The amplitude is sufficiently low to not disturb the data in the cell. The voltage or current developed on a data line during the pulse ($V_{READ}/I_{READ}$) may be sampled to obtain (e.g., receive) useful information for a subsequent write cycle. The subsequent write cycle may be, but is not necessarily, the next write cycle. The useful information may be, for example, the resistance of the cell ($R_{READ}$) (which is dependent from cross-sectional pillar area (A) of the cell) or may be dependent on the resistance of the cell. For example, the current flowing through a data line coupled to the cell ($I_{READ}$) is proportional to $R_{READ}$, which is proportional to the cross-sectional pillar area (A) of the cell. A critical switching current ($I_{SW}$) value is also dependent from pillar area (A) and the critical switching current density (Jc) ($I_{SW} \approx A*Jc$). Thus, $I_{READ}$ can be used to indirectly provide information about the critical switching current ($I_{SW}$) value of that cell. By way of example, a subsequent write operation may apply (e.g., force) a ramp voltage on the selected access line and the resultant current flowing through a data line coupled to the cell may be sensed. The data line may be deselected responsive to (e.g., when) the value of the current flowing through the data line being greater than the $I_{SW}$ value. In an example, this can be implemented by setting a value of a reference current to be a sum of $I_{READ}$ and a $\Delta I$ value, where the $\Delta I$ value is a function of other information that may be contained in a look-up table. Examples of such other information include information such as data to be written, temperature, process corner, power supply voltages, topological location of the cell (access line and data line addresses) etc., in order to obtain a suitable reference current. After determining the reference current based on the useful information obtained during the read of a STT cell, a subsequent write operation to the SIT cell may cause current flow through the cell to ramp up until the current flowing through the data line reaches the reference current, at which point the current flow through the cell can be stopped.

Figure 2:
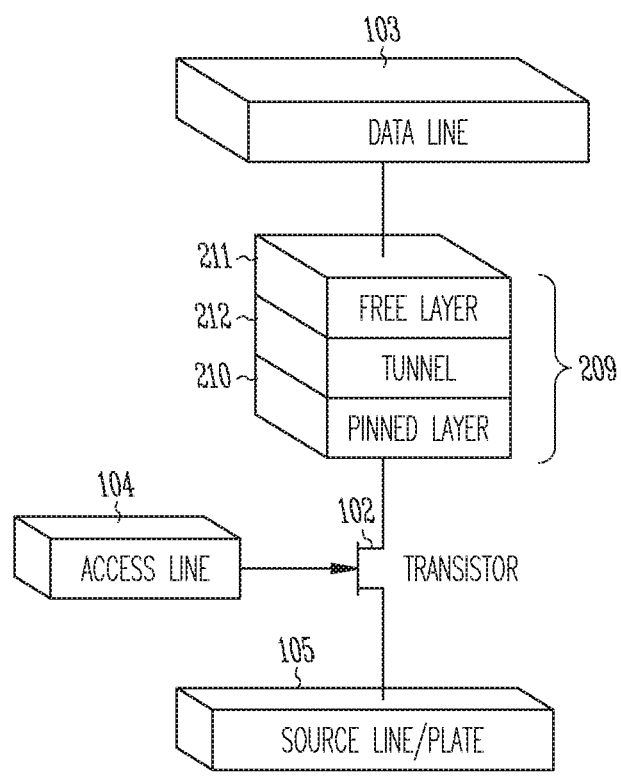
FIG. 2 illustrates in more detail an example of a STT cell.

FIG. 1 illustrates a portion of a memory 100 with a STT cell 101 coupled to an access device 102. The access device 102 can be, for example, a transistor, diode or other structure used to select a STT cell. In an embodiment, the access device 102 can be a vertical FET. The memory 100 can include an array of STT cells, and the array can include a data line 103, an access line 104, a source 105, read/write circuitry 106, a reference 107, and a sense amplifier 108. In operation, the STT cell 101 can be selected to be written. The read/write circuitry may generate and control application of a write pulse to a selected STT cell 101. The current flowing through the cell 101 can be spin-polarized by the pinned ferromagnetic materials of the cell structure such that a torque is exerted which can switch the magnetization to write (e.g. program) the cell 101. To read the STT cell, the read/write circuitry generates and controls application of a read pulse to the cell 101. The programmed state of the STT cell depends on the resistance across the cell 101, which may be determined by the voltage on the data line 103. In one or more embodiments, the voltage may be compared to the reference 107 and amplified by a sense amplifier 108. FIG. 2 illustrates in more detail an example of a STT cell. The STT cell may include an MTJ 209 with a pinned layer 210 and a free layer 211 separated by a tunnel barrier 212. An example of a tunnel barrier is MgO.

Figure 3:
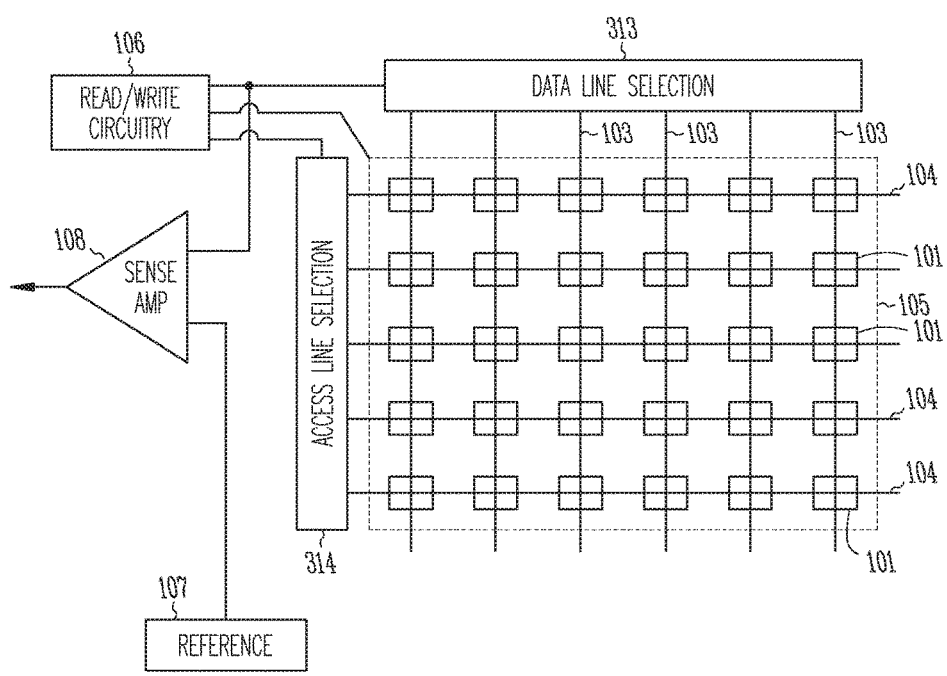
FIG. 3 illustrates an example of a portion of a memory array in which STT cells are arranged in column and rows.

FIG. 3 illustrates an example of a portion of a memory array in which STT cells 101 are arranged in column and rows. A data line 103 is coupled to each STT cell 101 in a column of cells, and an access line 104 is coupled to each access device corresponding to each STT cell 101 in a row of cells. The read/write circuitry 106 may be coupled (e.g., operably connected, whether directly or indirectly, such as by an ohmic connection) to data line selection circuitry 313 and to access line selection circuitry 314 to select a data line and an access line corresponding to a selected STT cell 101 to be written or read. The read/write circuitry 106 may also be coupled to a source 105 that may be below the SIT cells 101. Thus, the read/write circuitry 106 controls the current that flows through a selected STT cell 101. A selected STT cell 101 may be read by causing a read current ($I_{READ}$) to flow through a data line coupled to the selected STT cell 101 and sensing a voltage on a corresponding data line 103. A sense amplifier 108 may be used to compare the sensed voltage to a reference 107.

Figure 4:
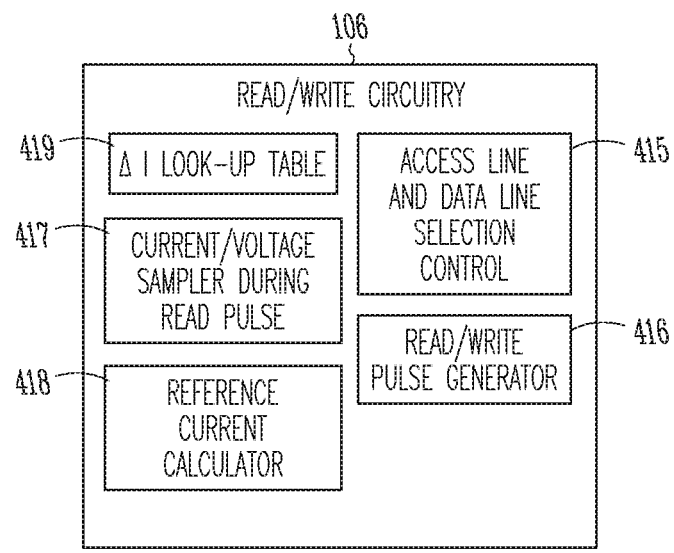
FIG. 4 illustrates an example of read/write circuitry, such as may be implemented in the read/write circuitry illustrated FIGS. 1 and 3.

FIG. 4 illustrates an example of read/write circuitry, such as may be implemented in the read/write circuitry 106 illustrated FIGS. 1 and 3. The illustrated read/write circuitry 106 includes selection control circuitry 415 for controlling the data line selection circuitry 313 illustrated in FIG. 3 to select a data line, and for controlling the access line selection circuitry 314 illustrated in FIG. 3 to select an access line. A selected data line and a selected access line enables the read/write circuitry to access a selected STT cell for writing or reading. The illustrated read/write circuitry 106 also includes a pulse generator 416 configured to generate an appropriate read pulse to read a selected STT cell, and to generate an appropriate write pulse to write a selected STT cell. The read/write circuitry 106 may further include sampler circuitry 417 configured to sample current or to sample voltage during a read pulse when a selected STT cell is read. These samples may be used by a reference current calculator 418 to determine (e.g., calculate) a value of a generated reference current to use when writing the selected STT cell. In some embodiments, the read/write circuitry 106 includes or otherwise is capable of accessing a $\Delta I$ look-up table 419 to find a value to be added to a value of $I_{READ}$ to calculate the generated reference current value. The $\Delta I$ value is a function of other information such as data to be written. For example, some data may require a lower BER, which may correspond to larger $\Delta I$ value to provide a larger reference current to be used when writing the STT cell. Other examples of information that may be used to select a $\Delta I$ value may include temperature, power supply voltages, access line and data line address, and process corners. A process corner refers to variations in an integrated circuit as applied to a semiconductor wafer. Process corners represent the extremes of these parameter variations within which a circuit that has been formed on or in the wafer must function correctly.

Figure 5:
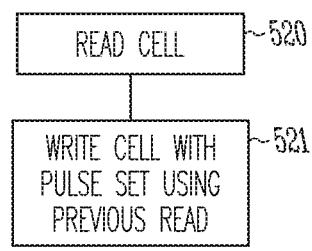
FIG. 5 illustrates an example of a method for setting a signal to write a STT cell.

FIG. 5 illustrates an example of a method for setting a signal in variable resistance memory, such as a signal used to write a STT cell. The illustrated method sets a reference current used when writing a cell based on a parameter sensed during a previous read of the cell. The reference current can be set to limit a programming current flowing through the cell to a magnitude that is effective for that cell, thus reducing BER, while also avoiding an excessively large magnitude that could contribute to degradation of the tunnel barrier. At 520, the memory cell is read to obtain cell-specific information. For example, an $I_{READ}$ may be sampled when a voltage is applied across the memory cell. At 521 the memory cell may be written using a write pulse limited in accordance with cell-specific information obtained during the previous read. For example, if the cell-specific information obtained during a read process is $I_{READ}$, then the reference current used to limit the write pulse may be set as a function of $I_{READ}$ or otherwise based on $I_{READ}$.

Figure 6:
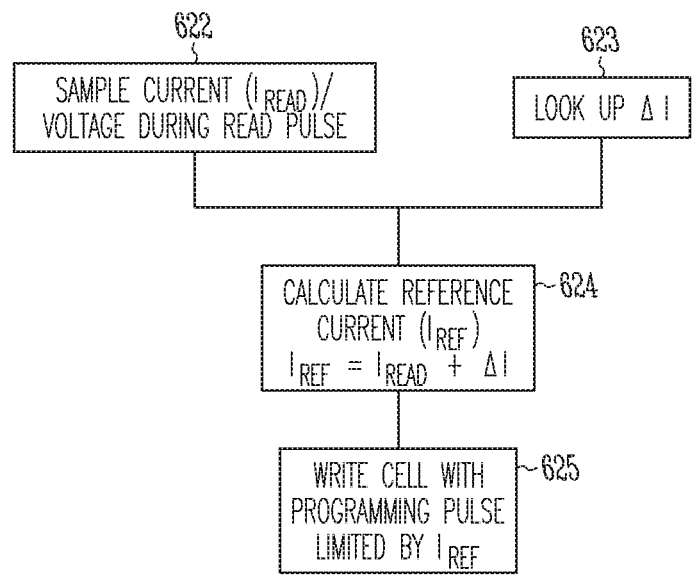
FIG. 6 illustrates a more detailed example of a method for setting a signal to write a STT cell.
Figure 7:
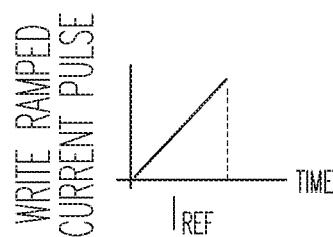
FIG. 7 illustrates an example of a ramped-up write pulse limited by a reference current.

FIG. 6 illustrates a more detailed example of a method for setting a signal in a variable resistance memory. At 622 the voltage across the cell or the current flowing through a data coupled to the cell ($I_{READ}$) is sampled during the read process. For example, if the read process involves placing a read voltage across the cell to measure a resulting current ($I_{READ}$) to measure a resistive state of the cell, then $I_{READ}$ may be sampled. If the read process involves delivering a read current through the cell to measure a resulting voltage across the cell to measure a resistive state of the cell, then the read voltage ($V_{READ}$) may be sampled. $I_{READ}$ is used in this discussion as an example, and the reference current may be set as a function of $I_{READ}$ or otherwise based on $I_{READ}$. Some embodiments use additional information to set the reference current. At 623 a $\Delta I$ value may be looked up, where the $\Delta I$ value is based on this additional information. The $\Delta I$ value may be looked up before, after, or contemporaneously with the sampling 622. A generated reference current value may be calculated at 624 as the sum of $I_{READ}$ and the $\Delta I$ value. The STT cell may then be written using the reference current as illustrated at 625. The write pulse that programs the cell may be implemented as a ramped-up current pulse, where the ramped current pulse is limited by the reference current, such as is generally illustrated by the ramped pulse signal in FIG. 7.

Figure 8:
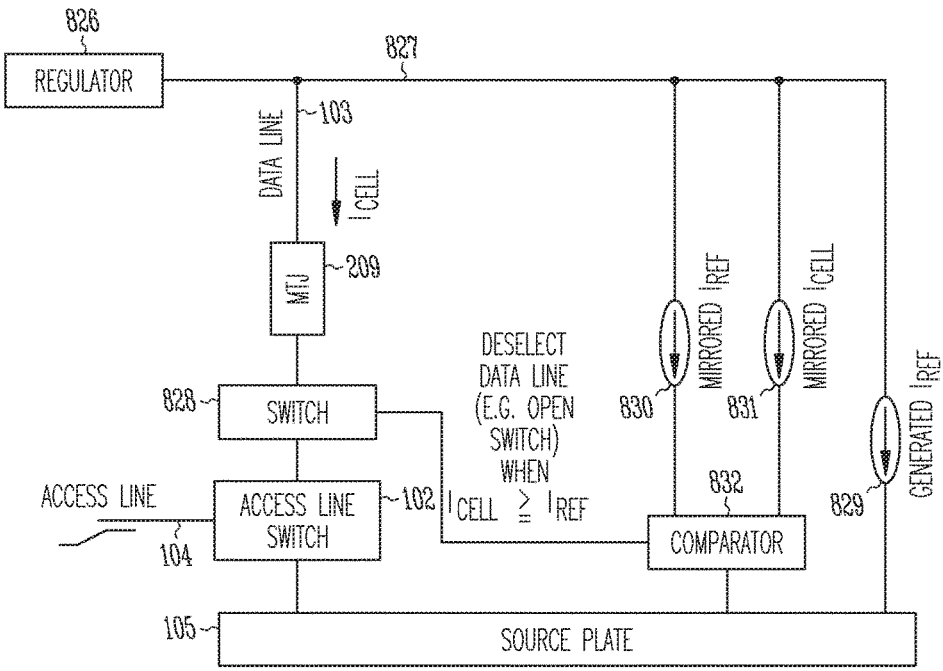
FIG. 8 illustrates, by way of example, an embodiment of circuitry used in setting a signal to write a STT cell.

FIG. 8 illustrates, by way of example, an embodiment of circuitry used in setting a reference current used to write the STT cell. FIG. 8 illustrates a data line 103, an access line 104 and a MTJ 209. FIG. 8 further illustrates a regulator 826 for providing a regulated potential on line 827, an access device 102 that functions as a switch as labeled in FIG. 8, and a data line deselect switch 828 (which can correspond to the data line selection circuitry 313 of FIG. 3). If the data line is selected, such that both 102 and 828 conduct, current can flow from line 827 through the MTJ to the source 105. This current flowing through the variable resistance memory cell 209 may be referred to as cell current ($I_{CELL}$). A ramped potential may be applied on the access line 104 to cause the $I_{CELL}$ through the cell 209 to be a ramped current pulse. The $I_{CELL}$ can be sensed as the potential on the access line ramps up. The voltage on the data line may be common for all data lines coupled to cells that will be programmed, but the ramp-up of $I_{CELL}$ for a particular cell can be limited to the reference current specifically set for that cell. For example, FIG. 8 also illustrates current sources, including a generated reference current source 829 to provide the generated reference current, a first mirrored current source 830, and a second mirrored current source 831. A comparator 832 is configured to compare the mirrored reference current and the mirrored $I_{CELL}$ from the mirrored current sources 830 and 831, respectively, and to cause the data line 103 to be deselected via switch 828 when $I_{CELL}$ is greater than or equal to the reference current. The deselected data line 103 limits the ramped $I_{CELL}$ pulse to the reference current, as generally illustrated by the ramped pulse signal in FIG. 7.

Figure 9:
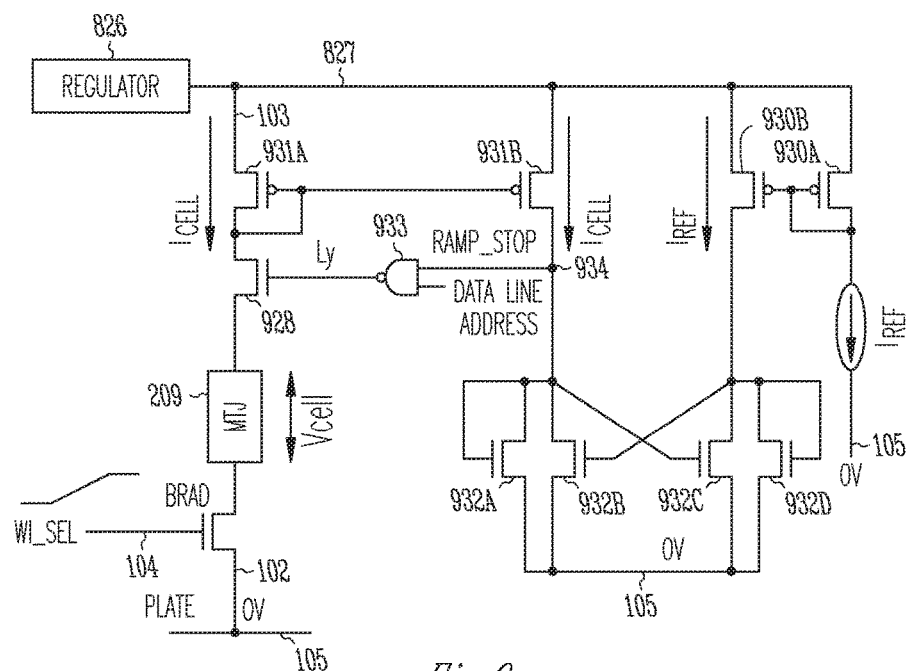
FIG. 9 illustrates, by way of example, a more specific embodiment of circuitry used in setting a signal to write a STT cell.

FIG. 9 illustrates, by way of example, a more specific embodiment of circuitry used in setting a reference current used to write a STT cell. FIG. 9 illustrates a data line 103, and access line 104 and a MTJ 209. FIG. 9 further illustrates a regulator 826 for providing a regulated potential on line 827, an access device 102, and a source 105. Transistor 928 functions as the deselect switch 828 in FIG. 8. Transistors 931A and 931B function to provide the mirrored $I_{CELL}$ current source 831 in FIG. 8, and transistors 930A and 930B function to provide the mirrored reference current source 830 in FIG. 8. Transistors 932A-D and a logic gate 933 can function together to provide the comparator 832 illustrated in FIG. 8 to cause the data line 103 to be deselected via transistor 928 when $I_{CELL}$ is greater than or equal to the reference current. The cross gate connection of transistors 932B and 932C increases the gain. Initially, the reference current is greater than $I_{CELL}$, such that node 934 will be low. When $I_{CELL}$ increases, switching takes place when the drain-source voltage of transistor 932B is equal to the threshold voltage of transistor 932C. Transistor 932C begins to take current away from transistor 932D, decreasing the drain-source voltage of transistor 932D, which starts to turn transistor 932B off. Transistor 932B shuts off and transistor 932C turns on, such that node 934 is high. The data line address is high when the data line is selected. When node 934 is also high, the logic gate 933 has an output to turn off transistor 928. If transistor 928 is an NFET, then a NAND type logic gate may be used to provide a low potential to turn off the NFET when both the data line address and node 934 are high.

Some embodiments may compensate for the parasitic capacitance present on the data line. The charge stored by the parasitic capacitance can cause the actual current flowing through the data line to vary slightly from the nominal $I_{CELL}$. Some embodiments determine the contribution to the current from the parasitic capacitance and provide a corresponding current offset to the generated reference current to compensate for the parasitic capacitance.

Figure 10:
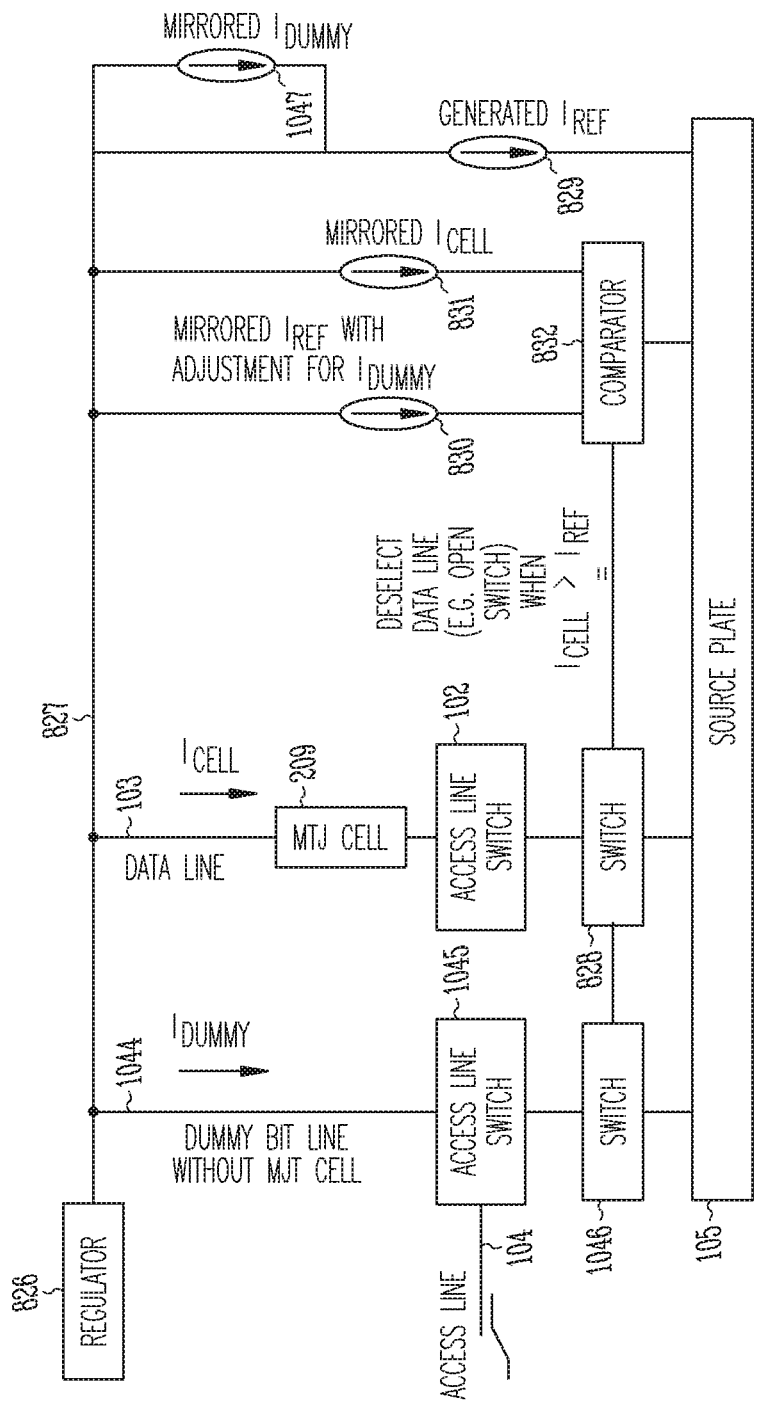
FIG. 10 illustrates, by way of example, an embodiment of circuitry used in setting a signal to write a STT cell that is similar to the circuitry used in FIG. 8, but that also compensates for data line capacitance.

FIG. 10 illustrates, by way of example, an embodiment of circuitry used in setting a reference current used to write a STT cell that is similar to the circuitry used in FIG. 8, but that also compensates for data line capacitance. Similar to FIG. 8, FIG. 10 illustrates a data line 103, an access line 104, a MTJ 209, a regulator 826 for providing a regulated potential on line 827, an access device 102 that functions as a switch as labeled in FIG. 10, and a data line deselect switch 828. If the data line is selected, such that both 102 and 828 conduct, current can flow from line 827 through the MTJ to the source 105. This current through the MTJ may be referred to as the cell current, $I_{CELL}$. A ramped potential may be applied on the access line 104 to cause $I_{CELL}$ to be a ramped pulse. The current on the data line can be sensed as the potential on the access line ramps up. The write pulse (e.g., voltage) may be common for all data lines corresponding to cells to be written, but the ramp-up of $I_{CELL}$ through each cell can be limited to the reference current set for that cell. Similar to FIG. 8, FIG. 10 also illustrates current sources, including a reference current source 829 to provide a generated reference current, a first mirrored current source 830, and a second mirrored current source 831, and further illustrates a comparator 832 configured to compare the mirrored reference current and the mirrored $I_{CELL}$ from the mirrored current sources 830 and 831, and to deselect the data line 103 via a deselect switch 828 when $I_{CELL}$ is greater than or equal to the reference current. In addition to the circuitry illustrated in FIG. 8, FIG. 10 also illustrates a dummy data line 1044 that mimics the data line 103 with a dummy access device 1045 and a dummy deselect switch 1046, but without a STT cell. An $I_{DUMMY}$ current caused by parasitic capacitance may flow on the dummy data line 1044, and a mirrored $I_{DUMMY}$ current source 1047 may add this current the generated reference current, such that the mirrored reference current is adjusted by the mirrored $I_{DUMMY}$ current. As a result the ramped $I_{CELL}$ current through the MTJ can be limited by the sum of the generated reference current and the $I_{DUMMY}$ current.

Figure 11:
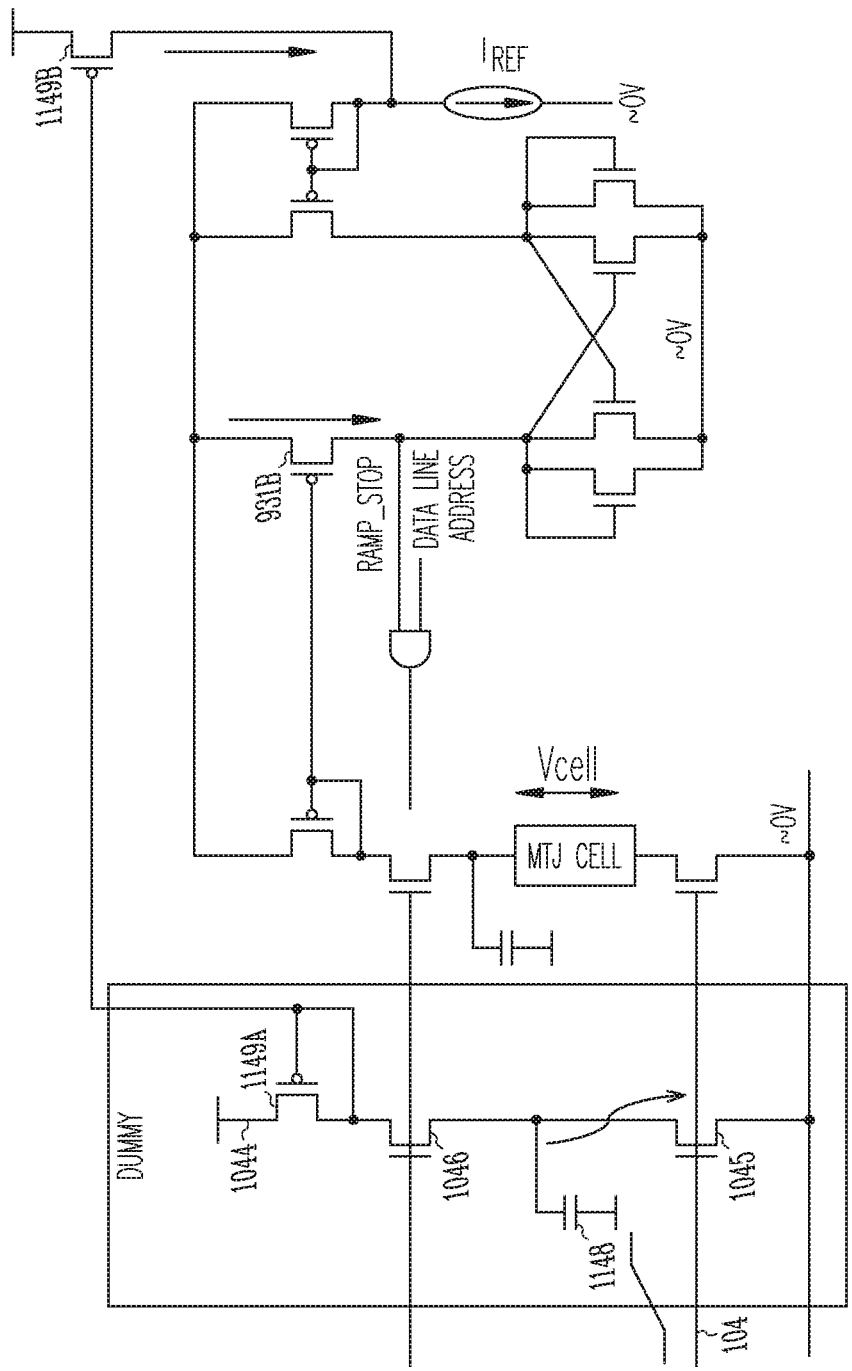
FIG. 11 illustrates, by way of example, a more specific embodiment of circuitry used in setting a signal to write a STT cell that also compensates for data line capacitance.

FIG. 11 illustrates, by way of example, a more specific embodiment of circuitry used in setting a reference current for the STT cell that also compensates for data line capacitance. FIG. 11 illustrates, by way of example, an embodiment of circuitry used in setting switching current for the STT cell that is similar to the circuitry used in FIG. 9, but that also compensates for data line capacitance. In addition to the circuitry illustrated in FIG. 9, FIG. 11 also illustrates a dummy data line 1044 with a dummy access device 1045 and a dummy deselect switch 1046, but without a STT cell. Parasitic capacitance 1148 may cause an $I_{DUMMY}$ current to flow on the dummy data line 1044 when the access line 104 is first selected. The dummy data line 1044 may be selected to allow the regulated potential to charge the parasitic capacitance, and then deselected. Subsequently, when the access line 104 is selected, then the charge associated with the parasitic capacitance can flow on the dummy data line 1044. Transistors 1149A and 1149B function to provide the mirrored $I_{DUMMY}$ current source 1047 illustrated in FIG. 10.

Some advantages of the above-described STT technology is that it provides a self-referencing programming pulse which can be effectively high to reduce BER and which can improve reliability by avoiding excessively high programming pulses, thus improving the ability to better withstand numerous write cycles. Further, the above-described STT technology that use a self-referencing programming pulse is insensitive to process spread reflected by variations in the manufacturing process that may affect access devices.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description.

What is claimed is:

1. A method, comprising:
reading a variable resistance memory cell using a read current; and
setting a signal to write to the memory cell using the read current.

2. The method of claim 1, wherein setting the signal to write the memory cell further depends on data to be written into the memory cell.

3. The method of claim 1, wherein setting the signal to write the memory cell further depends on a temperature.

4. The method of claim 1, wherein setting the signal to write the memory cell further depends on a process corner.

5. The method of claim 1, wherein setting the signal to write the memory cell further depends on a power supply voltage.

6. The method of claim 1, wherein setting the signal to write the memory cell further depends on a topological location of the memory cell.

7. The method of claim 1, wherein setting the signal includes obtaining information related to the read current and determining a reference current using the information related to the read current, the method further comprising writing the memory cell, wherein writing the memory cell includes applying a current ramp up to the reference current.

8. The method of claim 7, wherein applying a current ramp up to the reference current includes comparing a current flowing through a data line coupled to the memory cell to the reference current.

9. The method of claim 7, further comprising looking up a value from a look-up table, wherein determining the reference current includes summing the read current and the looked up value to determine the reference current.

10. The method of claim 9, wherein the looked up value is a function of information that includes at least one type of information selected from the group of information types consisting of:
data to be written into the memory cell;
a temperature;
a process corner;
a power supply voltage; and
a topological location of the memory cell.

11. The method of claim 1, further comprising using a dummy data line to compensate the reference current for the data line capacitance.

12. An apparatus, comprising:
a variable resistance memory cell; and
circuitry configured to read the memory cell using a read current, and set a signal to write the memory cell based on the read current.

13. The apparatus of claim 12, wherein the circuitry includes:
selection circuitry configured to select a memory cell, the selection circuitry including data line selection control circuitry to select a data line and access line selection circuitry configured to select an access line;
a pulse generator configured to generate a read pulse to read the selected memory cell and a write pulse to write the selected memory cell;
a sampler configured to generate a sample of current or voltage during the read pulse; and
a reference current calculator configured to use the sample to calculate a value of a generated reference current for use when writing the selected memory cell.

14. The apparatus of claim 13, wherein the reference current calculator is configured to calculate the value of the generated reference current using the read current and data to be written into the memory cell.

15. The apparatus of claim 13, wherein the reference current calculator is configured to calculate the value of the generated reference current using the read current and a temperature.

16. The apparatus of claim 13, wherein the reference current calculator is configured to calculate the value of the generated reference current using the read current and a process corner.

17. The apparatus of claim 13, wherein the reference current calculator is configured to calculate the value of the generated reference current using the read current and a power supply voltage.

18. The apparatus of claim 13, wherein the reference current calculator is configured to calculate the value of the generated reference current using the read current and a topological location of the memory cell.

19. The apparatus of claim 13, further comprising a look-up table, wherein the reference current calculator is configured to calculate the value of the generated reference current using the read current and a value in the look-up table.

20. The apparatus of claim 12, wherein the variable resistance memory cell includes a magnetic random access memory (MRAM) cell, the apparatus further comprising an access device configured to control a cell current in the MRAM cell.

* * * * *